(12) United States Patent
Hennig et al.

(10) Patent No.: US 8,591,652 B2
(45) Date of Patent: Nov. 26, 2013

(54) SEMI-CONDUCTOR SUBSTRATE AND METHOD OF MASKING LAYER FOR PRODUCING A FREE-STANDING SEMI-CONDUCTOR SUBSTRATE BY MEANS OF HYDRIDE-GAS PHASE EPITAXY

(75) Inventors: Christian Hennig, Berlin (DE); Markus Weyers, Wildau (DE); Eberhard Richter, Berlin (DE); Guenther Traenkle, Berlin (DE)

(73) Assignee: Freiberger Compound Materials GmbH, Freiberg (DE)

( * ) Notice: Subject to any disclaimer, the term of this patent is extended or adjusted under 35 U.S.C. 154(b) by 1197 days.

(21) Appl. No.: 11/996,446

(22) PCT Filed: Aug. 24, 2006

(86) PCT No.: PCT/EP2006/065659
§ 371 (c)(1),
(2), (4) Date: Jan. 22, 2008

(87) PCT Pub. No.: WO2007/025930
PCT Pub. Date: Mar. 8, 2007

(65) Prior Publication Data
US 2010/0096727 A1    Apr. 22, 2010

(30) Foreign Application Priority Data
Aug. 29, 2005  (DE) .......... 10 2005 041 643

(51) Int. Cl.
*C30B 25/04* (2006.01)
(52) U.S. Cl.
USPC .......... 117/95; 117/84; 117/88; 117/94; 117/97; 117/101; 252/518.1; 252/521.6; 252/584; 257/615; 257/E33.025; 257/E33.028; 257/E33.03; 257/E33.033

(58) Field of Classification Search
USPC .......... 257/613, 615, E33.025, E33.028, 257/E33.03, E33.033; 438/478; 117/84, 88, 117/94–95, 97, 101, 952; 252/518.1, 521.6, 252/584
See application file for complete search history.

(56) References Cited

U.S. PATENT DOCUMENTS

| | | | |
|---|---|---|---|
| 4,323,719 A * | 4/1982 | Green .......... | 136/249 |
| 4,868,633 A | 9/1989 | Plumton et al. | |
| 5,675,856 A * | 10/1997 | Itzkowitz .......... | 15/77 |
| 6,146,457 A | 11/2000 | Solomon | |

(Continued)

FOREIGN PATENT DOCUMENTS

| | | |
|---|---|---|
| DE | 100 11 876 A1 | 9/2000 |
| DE | 103 13 062 A1 | 11/2003 |

(Continued)

OTHER PUBLICATIONS

Machine translation of DE 10313062 is attached.*

(Continued)

*Primary Examiner* — Michael Kornakov
*Assistant Examiner* — Kenneth A Bratland, Jr.
(74) *Attorney, Agent, or Firm* — Foley & Lardner LLP

(57) ABSTRACT

The invention relates to a free-standing semiconductor substrate as well as a process and a mask layer for the manufacture of a free-standing semiconductor substrate, wherein the material for forming the mask layer consists at least partially of tungsten silicide nitride or tungsten silicide and wherein the semiconductor substrate self-separates from the starting substrate without further process steps.

20 Claims, 3 Drawing Sheets

(56) References Cited

U.S. PATENT DOCUMENTS

| | | |
|---|---|---|
| 6,325,850 B1 | 12/2001 | Beaumont et al. |
| 6,365,511 B1 * | 4/2002 | Kizilyalli et al. ............ 438/649 |
| 6,413,627 B1 | 7/2002 | Motoki et al. |
| 6,720,586 B1 | 4/2004 | Kidoguchi et al. |
| 6,740,604 B2 | 5/2004 | Kelly et al. |
| 6,806,571 B2 * | 10/2004 | Shibata et al. ............... 257/745 |
| 6,844,574 B1 | 1/2005 | Hiramatsu et al. |
| 6,911,351 B2 * | 6/2005 | Kidoguchi et al. ............ 438/46 |
| 7,097,920 B2 | 8/2006 | Usui et al. |
| 2002/0052076 A1 | 5/2002 | Khan et al. |
| 2003/0183157 A1 * | 10/2003 | Usui et al. ...................... 117/84 |
| 2004/0183090 A1 * | 9/2004 | Kitaoka et al. ................ 257/103 |
| 2005/0167775 A1 * | 8/2005 | Nagy et al. .................... 257/500 |
| 2006/0191467 A1 | 8/2006 | Usui et al. |

FOREIGN PATENT DOCUMENTS

| | | | |
|---|---|---|---|
| EP | 1 439 572 A2 | | 7/2004 |
| EP | 1439572 A2 | * | 7/2004 |
| EP | 1 528 590 A2 | | 5/2005 |
| JP | 2002-203793 A | | 7/2002 |
| JP | 2004-247711 A | | 9/2004 |
| JP | 2005-012171 A | | 1/2005 |
| JP | 2005-136200 A | | 5/2005 |
| WO | WO 99/20816 A1 | | 4/1999 |

OTHER PUBLICATIONS

Oshima et al., "Preparation of Freestanding GaN Wafers by Hydride Vapor Phase Epitaxy with Void-Assisted Separation", Jpn. J. Appl. Phys., vol. 42, No. 2 (2003), pp. L1-L3.

Tavernier et al., "Growth of thick (1120) GaN using a metal interlayer", Appl. Phys. Letters, vol. 85, No. 20 (2004), pp. 4630-4632.

Hiramatsu et al., "GaN layer structures with buried tungsten nitrides ($WN_x$) using epitaxial lateral overgrowth via MOVPE", Materials Science and Engineering, vol. B82 (2001), pp. 62-64.

* cited by examiner

US 8,591,652 B2

SEMI-CONDUCTOR SUBSTRATE AND METHOD OF MASKING LAYER FOR PRODUCING A FREE-STANDING SEMI-CONDUCTOR SUBSTRATE BY MEANS OF HYDRIDE-GAS PHASE EPITAXY

FIELD OF THE INVENTION

The present invention relates to a semiconductor substrate as well as a process and a mask layer for the manufacture of a free-standing semiconductor substrate by means of hydride vapour phase epitaxy, in particular a process for the manufacture of free-standing gallium nitride (GaN)-, aluminum nitride (AlN)- and aluminum gallium nitride (AlGaN)-, indium nitride (InN)- and indium gallium nitride (InGaN)- substrates by means of hydride vapour phase epitaxy (HVPE), in which the semiconductor layer self-separates from a substrate (or starting/original substrate or foreign substrate) without further process steps.

BACKGROUND OF THE INVENTION

This self-separation is achieved through lateral epitaxial growth (ELO, Epitaxial Lateral Overgrowth) over a mask, wherein the mask is provided with openings (windows). In these windows, preferably a thin initial layer (or also starting layer) is uncovered, which had been grown on a substrate (such as, e.g., sapphire) in advance. Growth starts from these windows. After coalescence of the thus forming islands, a coherent/continuous semiconductor layer grows further. The tension between the starting substrate and the grown layer causes the self-separation of the semiconductor substrate to occur, which then can be removed from the reactor as a coherent wafer. Such a process is, for example, known from Applied Physics Letters, Vol. 85, No. 20, 15.11.2004, pp. 4630-4632.

Layered structures made of group III-nitrides (Ga, Al, In) form the basis for a multitude of modern devices for high frequency power electronics, e.g. communication systems based on HFETs (Heterojunction Field Effect Transistor), sensorics, radiation-resistant air space electronics and for opto-electronics, e.g. UV-, blue and white light-emitting diodes (LEDs) and blue laser diodes for illumination, printing, display, memory and communication appliances as well as medical applications. Such layers are typically manufactured by means of metal organic vapour phase epitaxy (MOVPE) as well as by means of molecular beam epitaxy (MBE) on a starting substrate.

An ideal starting substrate shall belong to the same material system as the layers grown thereon, for example a GaN substrate. Thereby, requirements for a low-defect growth, i.e. a sufficiently good to perfect lattice mismatching (homoepitaxy) and a conformance of the thermal expansion coefficients are provided for in advance. Depending on the application, a doping is advantageous, which renders the substrate n-conducting, semi-isolating or p-conducting.

Contrary to other semiconductors, e.g. silicon (Si) and gallium arsenide (GaAs), to date the manufacture of GaN crystals having diameters of 2 inch or more by means of conventional single crystal growth has been unsuccessful. Conventional processes such as growth from the melt under high pressures and temperatures (HPSG—high pressure solution growth) result in crystal plates in the dimension of $cm^2$ only. Up to now, growth by means of sublimation is unsuccessful, either. To date, the layered structures are therefore mostly epitaxially grown on foreign substrates such as, e.g., sapphire and silicon carbide (SiC) (heteroepitaxy). This is disadvantageous, e.g. with respect to the achievable dislocation densities and the warping resulting from different lattice constants and differences in thermal expansion. This warping partly also results in problems in the subsequent processing, because e.g. transfer of structures by means of photolithographic processes is limited on warped wafers in terms of resolution.

Therefore, attempts are made to produce GaN starting substrates which are grown on an initial starting substrate and separated therefrom.

U.S. Pat. No. 6,740,604 describes a process, wherein after the growth of a GaN layer on a starting substrate, this layer is separated in a subsequent process by means of laser irradiation. Thereby, a further process step is necessary, which is laborious and limited in yield for larger areas. Furthermore, this process does not solve the problem of warping, since the package consisting of GaN-layer and -substrate is cooled from growth temperature to room temperature. The warping of the layer induced by the thermal misalignment partly maintains still after separation from the starting substrate.

U.S. Pat. No. 6,413,627 describes a process applied on a GaAs starting substrate. Here, GaN is grown on both sides of a GaAs substrate being structured with a dielectric mask. This process requires a laborious etching process for removing the GaAs substrate, which, moreover, is toxic. Only one of both GaN layers can respectively be used, and a specific apparatus is necessary for dual sided growth.

Oshima et al. (Y. Oshima, T. Eri, N. Shibata, H. Sunakawa, K. Kobayashi, T. Ichihashi, A. Usui, *Preparation of Free-standing GaN Wafers by Hydride Vapor Phase Epitaxy with Void-Assisted Separation*, Jpn. J. Appl. Phys. 42, L1 (2003)) describe a process, wherein a porous layer of TiN is deposited on a GaN initial layer, wherein growth of GaN starts out of the pores. However, it is unclear how the porosity of this TiN layer can be controlled, and whether this process can be performed in a reproducible manner. In the process proposed, the thick GaN layer is separated from the initial substrate by external forces, which requires an additional process step as well as an apparatus necessary therefore.

The process of lateral epitaxial overgrowth (ELO or ELOG) is known from WO 99/20816 as a possibility of reducing defects. Dielectric mask materials for the ELOG process are described therein. This process however does not avoid warping of the package consisting of starting substrate and GaN layer.

From DE 100 11 876 A1, the use of a metallic mask is known, which consists of tungsten in this case. Both publications deal with reducing defect density by the ELOG process. The formation of a free-standing substrate is not an object of these works.

Furthermore, a process for growing GaAs is known from U.S. Pat. No. 4,868,633, wherein not a lateral overgrowth of a multitude of column-shaped initial regions, but—contrary to that—a growth of a limited region is sought. A lateral overgrowth shall even be avoided. Therefore, a WSi:Zn mask is used, wherein the WSi:Zn mask shall avoid a lateral overgrowth. In FIGS. 1 and 2 of U.S. Pat. No. 4,868,633 (and the associated text), it is investigated how GaAs can be grown in the region of the column and its surrounding. When the concentration of W in the uppermost layer of a WSi mask is high, an island formation is suppressed. When the concentration of Si in the uppermost layer of the WSi mask however is high, a layer made of polycrystalline GaAs can be formed on the WSi mask. Since the formation of a GaAs layer on the WSi mask shall be avoided, the WSi mask is doped with zinc.

Furthermore, the use of $WN_x$ masks for the manufacture/treatment of GaN layers is published in Materials Science and Engineering: B, Vol. 82, No. 1, 22 May 2001, pp. 62-63 (3) (Abstract), wherein the $WN_x$ mask is used instead of a W mask, in order to avoid separation of a GaN layer.

The U.S. Pat. No. 6,146,457 describes a process, wherein a semiconductor layer is deposited by means of vapour phase epitaxy on a growth support consisting of a Si-, SiC- or sapphire-substrate and a thin intermediate layer, wherein defects are caused in the substrate but not in the epitaxial layer in the subsequent cooling due to different thermal expansion coefficients of semiconductor layer and substrate, thereby obtaining a highly qualitative semiconductor layer. In claim 3, silicon oxide, silicon nitride or silicon carbide are explicitly mentioned as possible materials for the intermediate layer. According to claim 4, the intermediate layer may also be structured, while the ELOG process for reducing defect density is neither mentioned nor described. Moreover, neither in the claims nor in the embodiments, a free-standing semiconductor substrate as a result of the process is mentioned.

Therefore, the object of the present invention is to provide a process for the manufacture of a free-standing (i.e. non-bound to a substrate) semiconductor layer, preferably made of gallium nitride (GaN), aluminum nitride (AlN), aluminum gallium nitride (AlGaN), indium nitride (InN) or indium gallium nitride (InGaN), which needs process steps as few as possible and which furthermore enables the manufacture of a planar, but not or only slightly warped or bowed semiconductor layer. Furthermore, a free-standing substrate shall be provided which is obtainable at low costs and which has a very good planarity.

These objects are solved according to the present invention by subject-matter with the features of the independent claims. Preferred embodiments are set forth in the subclaims.

The process according to the present invention for the manufacture of a semiconductor substrate is characterized by the following process steps:

providing a starting substrate, forming a mask layer with a multitude of openings on the initial substrate, growth of at least one semiconductor substrate, wherein the mask layer is laterally overgrown by at least one semiconductor material, and subsequently cooling the starting substrate, the mask layer and the semiconductor substrate, wherein the material for forming the mask layer at least partially consists of tungsten silicide nitride or tungsten silicide, separation of semiconductor substrate and starting substrate already during the growth or not before cooling, so that a semiconductor substrate is obtained free-standing, and wherein the semiconductor substrate contains at least one nitride compound semiconductor.

Preferably, the material for forming the mask layer consists completely of tungsten silicide nitride or completely of tungsten silicide. Preferably, the mask layer of tungsten silicide nitride or of tungsten silicide is not doped with other substances.

Tungsten silicide nitride is particularly preferred. Preferably, a continuous initial layer is grown on the substrate before forming the mask layer, and the mask layer is deposited on the initial layer. Alternatively, it is possible to deposit the mask layer directly on the substrate without an initial layer, which is beneficial particularly for SiC substrates.

The structured mask layer is prepared preferably by depositing a continuous mask layer by means of sputtering or vapour phase deposition and subsequently introducing a multitude of openings. The openings are preferably introduced into the mask layer dry-chemically by means of plasma etching. Alternatively, wet-chemical etching or a lift-off process is possible as well.

On the thus structured mask layer, starting from the openings, at least a first semiconductor layer—the coalescence layer—made of semiconductor material is grown, which completely covers the mask material and forms a continuous layer.

The initial layer preferably contains a nitride compound semiconductor, particularly preferably a nitride compound of elements of the third and/or fifth main group, particularly preferably GaN, AlN, AlGaN, InN, InGaN, AlInN or AlInGaN.

On the first semiconductor layer, a further semiconductor layer may be deposited, preferably in the same growth process. The thickness is preferably more than 50 µm, more preferably more than 200 µm. Alternatively, the first semiconductor layer may also be produced in a first growth process and overgrown in a second growth process, over the whole area, by a second semiconductor layer. Preferably, also this second semiconductor layer contains a nitride compound semiconductor, particularly preferably a nitride compound of elements of the third and/or fifth main group, particularly preferably GaN, AlN, InN, InGaN, AlGaN, AlInN or AlInGaN.

Preferably, the starting substrate contains silicon carbide or sapphire. Preferably, on the thus produced semiconductor layer, further semiconductor layers, preferably containing a nitride compound semiconductor, or a metallic contact are placed for forming an electronic or opto-electronic device.

The free-standing semiconductor substrate is preferably formed by crack formation at the interface to the starting substrate as well as in the regions of the semiconductor substrate within the openings of the mask, based on the tensile stress during the growth or the different thermal expansion coefficients of the starting substrate and the at least one semiconductor substrate during cooling.

The semiconductor substrate according to the invention for producing electronic or opto-electronic devices comprises a nitride compound semiconductor (preferably GaN, AlN, AlGaN, InN, InGaN, AlInN, or AlInGaN), wherein the semiconductor substrate according to the invention comprises traces of tungsten silicide nitride or traces of tungsten silicide or traces of silicon and tungsten. The concentration of the traces depends on the detection limit for such residues after separation. They amount preferably to more than $10^{15}$ atoms per cm$^3$. However, it can not be excluded that a semiconductor substrate can be produced by the process according to the invention, where the said traces cannot be detected.

The process enables the manufacture of low-defect, free-standing GaN wafers, which self-separate from the starting substrate. This separation may occur already during the growth due to tensile stresses of the grown semiconductor layer increasing with increasing layer thickness, or yet at the latest by the different thermal expansion coefficients during the cooling from a growth temperature. It has been found that such a separation occurs particularly when using tungsten silicide nitride or tungsten silicide as the mask material. Therefore, an additional technological step for separation can be dispensed with. Due to separation already at high temperatures, the GaN wafers have only a low or no warping or bowing, which is advantageous for the further processing.

Therefore, the mask layer according to the invention for the manufacture of a semiconductor substrate consists at least partially of tungsten silicide nitride. Preferably, it consists completely of tungsten silicide nitride. Preferably, the mask layer made of tungsten silicide nitride is not doped with other substances.

Preferably, a suitable initial layer is used, on which the epitaxial growth of the semiconductor layer(s) (for example of GaN) is possible. This initial layer preferably consists of a some μm thick GaN layer, which had been deposited heteroepitaxially on a starting substrate. As the starting substrate for the growth of GaN, sapphire, SiC, Si and GaAs have already been demonstrated. As for the processes for preparing the initial layer, any technology can be used which deposits a closed GaN layer on a starting substrate. Here, MOVPE, HVPE and MBE are widely used processes. Alternatively, the initial layer may consist of AlN, AlGaN, InN, InGaN, AlInN or AlInGaN. Preferably, it consists of the material of the subsequently deposited first semiconductor layer—the coalescence layer. When growing on SiC, this start/initial layer is preferably omitted.

When using an initial layer, a thin mask layer is deposited, which consists at least partially of tungsten silicide (WSi) or tungsten silicide nitride (WSiN). Without an initial layer, the mask layer would be deposited directly on the substrate. ELOG-masks typically have thicknesses between 50 and 200 nm. The deposited WSi- or preferably WSiN-layer is lithographically structured, and windows are opened by wet- or dry-chemical etching processes, in which the initial layer or the substrate (SiC-substrate) is exposed. For structuring, other processes can be contemplated as well, such as a so-called lift-off process. Such structuring processes commonly used in the semiconductor technology enable a defined and reproducible preparation of openings in the mask layers. Preferably, these openings are largely provided periodically, have a circular or polygonal geometry, or consist of parallel disposed stripes.

The use of a porous WSiN layer without a subsequent step for structuring is also possible. Here, reproducibility of the result of the process however is to be ensured.

On the masked initial layer or the masked substrate, an at least 50 μm thick GaN/AlGaN-layer (or another nitride semiconductor layer) is grown subsequently by means of vapour phase epitaxy. Here, the material grows vertically out of the windows and laterally over the mask, until the growth fronts coalesce and form a flat layer again. According to the invention, this first semiconductor layer does not adhere to the described mask layer made of WSiN, which is an essential prerequisite for the subsequent self-separation. The joint to the starting substrate is formed exclusively by the opened windows (openings) in this mask layer.

When selecting SiC as starting substrate, the deposition of a GaN initial layer can be omitted. The WSiN mask layer is deposited directly onto the starting substrate and structured. Subsequently, a cohesive first semiconductor layer, the coalescence layer, made of GaN, AlN or AlGaN or another nitride semiconductor is grown by means of ELO. Immediately subsequent in the same epitaxy process, or alternatively in another epitaxy process, a second, thick semiconductor layer of a nitride semiconductor, preferably having a thickness greater than 50 μm, can be grown on the whole area on this coalescence layer.

Suitably choosing the mask geometry, the deposition parameters and the process control, the grown second thick semiconductor layer, together with the first semiconductor layer—the coalescence layer—separates on the whole area from the starting substrate, and a free-standing wafer of e.g. 2 inch diameter is formed. This wafer can then be used for growing structured layers for devices, or as a seed for growing volume crystals made of GaN, AlN or AlGaN or another nitride semiconductor, wherein optionally process steps for smoothing the surfaces (polishing, etching) may still be carried out.

BRIEF DESCRIPTION OF THE DRAWINGS

The invention will be subsequently explained in more detail in embodiments by means of Figures.

DETAILED DESCRIPTION OF THE EMBODIMENT OF THE INVENTION

Figure 1:
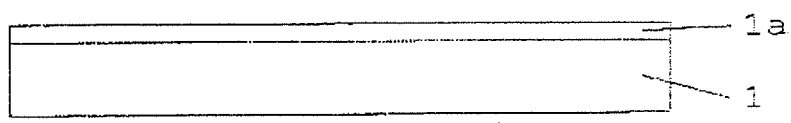
FIG. 1 shows, in a schematic sectional view, the provided starting substrate 1 having an initial layer 1a, FIG. 2 shows, in a schematic sectional view, the starting substrate including mask layer 2 (after forming the mask layer) as well as openings 3.
Figure 2:
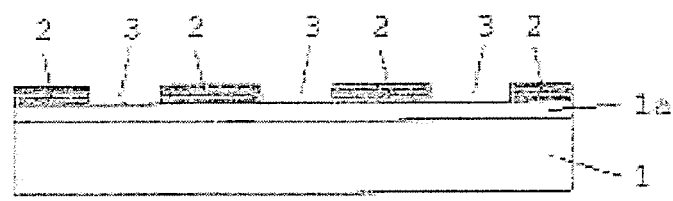
Figure 3:
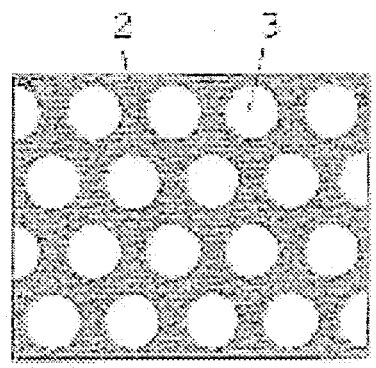
FIG. 3 shows, in a plan view, the starting substrate after forming the mask layer 2, having the openings 3.

In a first embodiment, a starting substrate 1 (c-plane sapphire wafer, 2 inch or 50.8 mm diameter) is subjected to be grown by a 2 μm thick initial layer 1a of GaN by means of MOVPE (FIG. 1). Subsequently, this initial layer 1a is covered on the whole area by a 100 nm thick, sputtered mask layer 2 (WSiN layer) (FIG. 2). This layer 2 is structured by means of lithography and subsequent etching process such that hexagonally disposed circular openings 3 (windows) are formed (FIG. 3). In the example, hexagonally disposed circular windows (openings 3) having 10 μm diameter and a distance between central points of adjacent windows of 15 μm are used.

Figure 4:
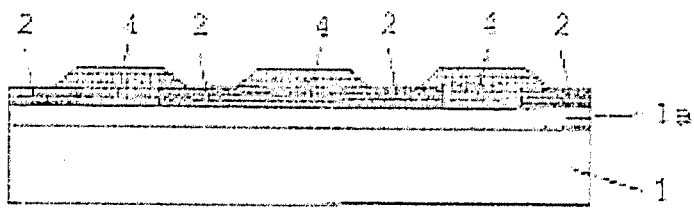
FIG. 4 shows, in a schematic sectional view, the starting substrate including the mask layer during the growth of the laterally growing first semiconductor layer 4 as coalescence layer.
Figure 5:
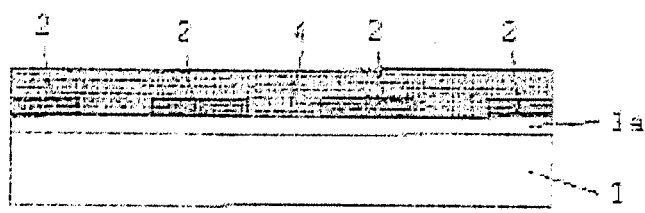
FIG. 5 shows, in a schematic sectional view, the starting substrate with the mask layer after the growth of the first semiconductor layer as the coalescence layer, which forms a cohesive layer.
Figure 6:
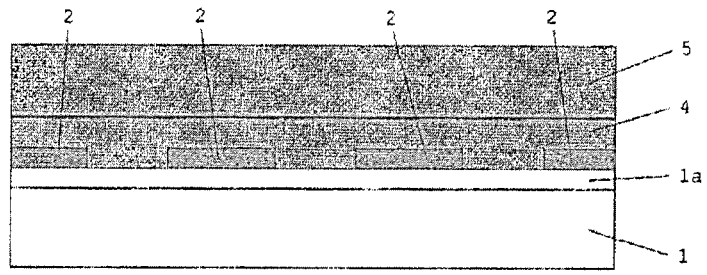
FIG. 6 shows the starting substrate after the at least one first semiconductor layer has been overgrown on the whole area by a second, thick semiconductor layer 5.
Figure 7:
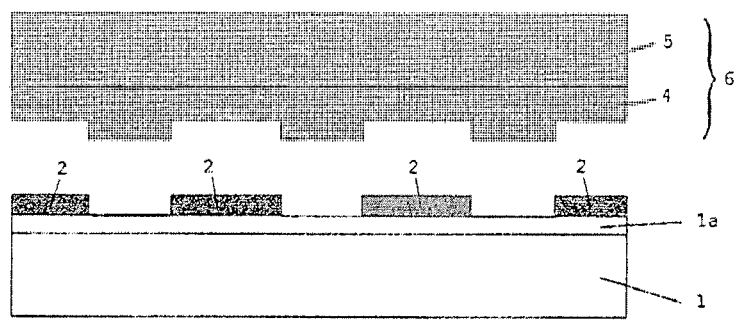
FIG. 7 shows the semiconductor substrate 6 according to the invention with the first semiconductor layer 4, separated from the starting substrate by self-separation.

On the thus structured starting substrate, firstly a first semiconductor layer 4 of GaN is then grown as a coalescence layer (FIG. 4 and FIG. 5). Here, the starting substrate 1 with the initial layer 1a, being structured with the mask layer 2 and the openings 3, is heated in a horizontal HVPE reactor up to 1,040° C., wherein the surface is stabilized by ammonia from 750° C. onwards. The growth occurs at 800 hPa reactor pressure and a temperature of 1,040° C. as well as a V/III ratio of 5. The growth rate for the whole-area growth here is 150 μm/h. After 5 minutes, the first semiconductor layer 4 is coherent in the form of a coalescence layer and has a medium thickness of about 10-15 μm. Subsequently, the coherent first semiconductor layer 4—the coalescence layer—is overgrown by a second semiconductor layer 5 having a thickness of above 100 μm, wherein thicknesses above 200 μm are advantageous (FIG. 6). In the embodiment, the semiconductor layer has a thickness of 450 μm. The stress occurring during growth between the starting substrate 1 and the grown semiconductor substrate 6 consisting of the first semiconductor layer 4—the coalescence layer—and the second semiconductor layer 5 effects, with the illustrated process control and the mask geometry, the separation of the grown semiconductor substrate 6 from the starting substrate 1 being present underneath, as shown in FIG. 7. During cooling with a rate of about 300° C./h, the surface is again stabilized by ammonia down to a temperature of 750° C. After termination of the process, the separated semiconductor substrate, here in the form of a GaN layer package, having a thickness of about 460 µm can be removed from the reactor.

In a second embodiment, a starting substrate 1 (c-plane sapphire substrate, diameter 50.8 mm) is subjected to be overgrown with a 2 µm thick GaN initial layer 1a by means of MOVPE (FIG. 1). Subsequently, this initial layer is covered over the whole area by a 100 nm thick, sputtered mask layer 2 (WSiN-layer) (FIG. 2). This layer is structured by means of lithography and subsequent etching process such that parallel extending stripes (openings 3) are formed. It is therefore used as a stripe mask.

The thus structured starting wafer 1, 2 is then overgrown with GaN by means of MOVPE such that islands growing out of the windows coalesce (FIG. 4/5). After coalescence is completed, on the obtained coherent GaN layer 4, a layer 5 made of GaN, AlN or AlGaN having a thickness above 50 µm is grown with a process suitable for enabling high growth rates, wherein thicknesses above 200 µm are advantageous (FIG. 6). The stress occurring during growth between the starting substrate 1 and the grown semiconductor substrate 6 effects, with a suitable process control and mask geometry, the separation of the grown layer from the starting substrate being present thereunder, as shown in FIG. 7.

In a third embodiment, a starting substrate 1 of SiC is used, and a prior deposition of an initial layer 1a is omitted. The SiC-wafer 1 is directly covered by the 100 nm thick, sputtered mask layer 2 (WSiN-layer). This layer 2 is structured by means of lithography and subsequent etching process such that hexagonally disposed, circular openings 3 (windows) are formed (FIG. 3).

The thus structured starting wafer 1, 2 is then overgrown with GaN by means of MOVPE such that islands growing out of the windows do coalesce. After coalescence is completed, a second semiconductor layer 5 of GaN, AlN or AlGaN having a thickness above 50 µm is grown on the obtained coherent GaN layer 4 by a process suitable for enabling high growth rates, wherein thicknesses above 200 µm are advantageous. The stress occurring during growth between the starting substrate 1 and the grown semiconductor substrate 6—consisting of the first semiconductor layer 4, the coalescence layer, and the thick, second semiconductor layer 5—and the thermal stress introduced by temperature variation, in particular by cooling from the growth temperature, effect with a suitable process control and mask geometry the separation of the grown layer 6 from the starting substrate 1 being present underneath.

Here the first semiconductor layer 4 and the second semiconductor layer 5 as grown may consist of the same material or of different materials. The semiconductor layers 4 and 5 may be grown in the same growth process or in different growth processes. The semiconductor substrate 6 may also consist of a first semiconductor layer 4 alone.

Figure 8:
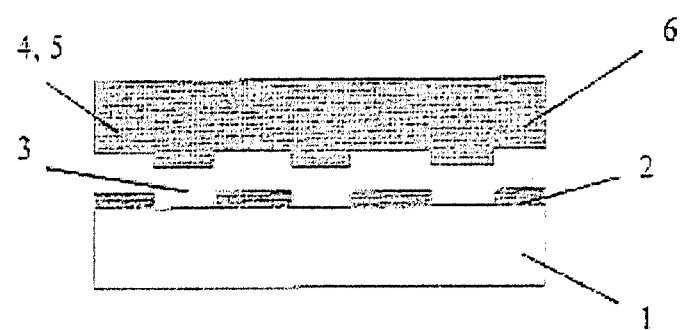
FIG. 8 shows the semiconductor substrate 6 according to the invention separated from the starting substrate by self-separation, wherein the first and second semiconductor layers 4, 5 are formed from the same material.

FIG. 8 shows a semiconductor substrate 6 according to the invention, wherein the second semiconductor layer 5 consists of the same material as the first semiconductor layer 4—the coalescence layer. Here, an initial layer 1a is omitted. Here, the second semiconductor layer was deposited in the same growth process. Therefore, the semiconductor layers 4 and 5 merge into each other.

The at least one first semiconductor layer 4 is preferably grown with a thickness of 1 to 50 µm. More preferably, the at least one first semiconductor layer 4 is grown with a thickness of 10 to 30 µm.

The second semiconductor layer 5 is preferably grown with a thickness of more than 100 µm, more preferably of more than 200 µm.

In each of the three embodiments the grown GaN-, AlN- and AlGaN-layers can be made in an aimed manner, by incorporating suitable dopants, p- or n-doping or also semi-isolating. An n-doping of the grown group III-nitride can be accomplished by the reaction of silicon with hydrogen chloride gas, or particularly simple by the addition of the silicon-containing compound di-cholorosilane ($Cl_2SiH_2$).

A p-doping of the grown group III-nitride can be accomplished by the reaction of magnesium Mg with hydrogen chloride gas, or by the addition of a magnesium-containing compound—as a surfactant or for being incorporated into the layer—, e.g. bis-cyclopentadienyl magnesium ($Cp_2Mg$: $Mg(C_5H_5)_2$), into the gas phase. In a similar manner, indium may also be used as a surfactant.

A doping of the grown group III-nitride for achieving semi-insulating electric properties may be accomplished by the reaction of iron (Fe) with hydrogen chloride gas, or by the addition of an iron-containing compound, e.g. bis-cyclopentadienyl iron (ferrocen: $Cp_2Fe$: $Fe(C_5H_5)_2$), into the gas phase.

Compared with a solid source, the use of a dopant gas simplifies the process, because a dopant gas can be continuously controlled.

The free-standing semiconductor substrate 6, which has been prepared according to the above process, may comprise, after separation, traces of tungsten silicide nitride or traces of tungsten silicide or traces of silicium and tungsten. Preferably, the traces lie in the range of more than $10^{15}$ atoms per $cm^3$, or in 1/10 of a monolayer or more. This value depends on the detection limit of the traces. Preferably, the traces lie in the region of lower than 200 nm.

The mask layer 2 according to the invention for the preparation of a free-standing semiconductor substrate 6 on a starting substrate 1 consists at least partially of tungsten silicide nitride or tungsten silicide. Preferably, the mask layer 2 consists completely of tungsten silicide nitride or tungsten silicide.

The obtained free-standing semiconductor layer made of GaN, AlN, AlGaN, InN, InGaN, AlInN or AlInGaN may be further used as a substrate (nitride-substrate) for the growth of group III-nitride—layer structures with MOVPE or with MBE, or by placing metallic contacts for producing electronic or opto-electronic devices. To this end, the surface may be polished. The nitride substrate may also be used as an initial layer for the further growth of group III-nitrides with HVPE.

The present invention is not limited to the presently illustrated embodiments. Rather, it is possible, by combination and modification of the mentioned means and features, to realize further embodiment variations, without deviating from the scope of the invention.

LIST OF REFERENCE SIGNS 1 starting substrate
1a initial layer
2 mask layer 3 opening
4 first semiconductor layer—coalescence layer
5 second semiconductor layer—thick semiconductor layer
6 semiconductor substrate

The invention claimed is:

1. Process for the manufacture of a semiconductor substrate, comprising the following process steps:
   a) providing a starting substrate,
   b) forming a mask layer with a multitude of concave openings on the starting substrate, wherein the mask layer is structured, either lithographically by opening windows through a wet- or dry-chemical etching process, or through a lift-off process,
   c) growing at least one semiconductor substrate vertically out of said concave openings obtained in step b), wherein the mask layer is laterally overgrown by at least one semiconductor material which completely covers, in contact, the mask material and whereby the growth fronts coalesce, and subsequently,
   d) cooling of starting substrate, mask layer and semiconductor substrate,
   wherein the material for forming the mask layer comprising at least partially of tungsten silicide nitride, and wherein a separation of semiconductor substrate and starting substrate occurs during the growth or during the cooling, and wherein a semiconductor substrate is obtained free-standing, wherein the semiconductor substrate contains at least a nitride compound semiconductor.

2. Process according to claim 1, wherein the free-standing semiconductor substrate is formed by crack formation in the starting substrate as well as in the regions of the semiconductor substrate within the openings of the mask due to different thermal expansion coefficients of starting substrate and the at least one semiconductor substrate during the cooling, or due to the tensile stress of the grown semiconductor layer during the growth.

3. Process according to claim 1, wherein in step c), at least a first semiconductor layer is grown as a coalescence layer, wherein the mask layer is laterally overgrown by the semiconductor material, until a coherent layer is formed, such that the semiconductor substrate consists of said at least one first semiconductor layer.

4. Process according to claim 3, wherein in step c) at least a second semiconductor layer is grown onto the at least one first semiconductor layer, such that the final semiconductor substrate consists of the at least one first semiconductor layer and the at least one second semiconductor layer.

5. Process according to claim 3, wherein the at least one first semiconductor layer is grown with a thickness of 1 to 50 µm.

6. Process according to claim 4, wherein the at least one second semiconductor layer is grown with a thickness of more than 100 µm.

7. Process according to claim 4, wherein the at least one first semiconductor layer and/or the at least one second semiconductor layer contain at least a nitride compound semiconductor.

8. Process according to claim 1, wherein, prior to step b) at least one initial layer, consisting of one or more individual layers, is grown over the whole area onto the starting substrate, and the mask layer is formed on the at least one initial layer.

9. Process according to claim 8, wherein the at least one initial layer contains at least a nitride compound semiconductor.

10. Process according to claim 1, wherein the at least one nitride compound semiconductor contained in the semiconductor substrate is a nitride compound of elements of the third and/or fifth main group.

11. Process according to claim 10, wherein the at least one nitride compound is GaN, AlN, AlGaN, InN, InGaN, AlInN or AlInGaN.

12. Process according to claim 1, wherein the at least one semiconductor layer is grown by means of hydride vapour phase epitaxy.

13. Process according to claim 8, wherein the at least one semiconductor layer is deposited by overgrowing the initial layer by means of lateral epitaxial overgrowth (ELOG).

14. Process according to claim 1, wherein the at least one semiconductor layer is grown such, that the islands growing out of the openings coalesce, and a coherent surface is formed.

15. Process according to claim 1, wherein, on the at least one semiconductor layer, subsequently at least one further GaN-, AlN-, AlGaN, InN-, InGaN-, AlInN- or AlInGaN-layer is deposited for the manufacture of thicker GaN-, AlN-, AlGaN-, InN-, InGaN-, AlInN- or AlInGaN-layers or GaN-, AlN-, AlGaN-, InN-, InGaN-, AlInN- or AlInGaN-single crystals.

16. Process according to claim 15, wherein the GaN-, AlN-, AlGaN-, InN-, InGaN-, AlInN- or AlInGaN-layers or GaN-, AlN-, AlGaN-, InN-, InGaN-, AlInN- or AlInGaN-single crystals are subsequently individualized by sawing.

17. Process according to claim 1, wherein at least one metallic contact is placed onto the semiconductor substrate for producing an electronic or opto-electronic device.

18. Free-standing semiconductor substrate for the manufacture of electronic or opto-electronic devices, wherein the free-standing semiconductor substrate is formed of a nitride compound semiconductor, wherein the free-standing semiconductor substrate comprises traces of tungsten silicide nitride and the traces of tungsten silicide nitride correspond to at least a concentration of $10^{15}$ atoms per cm$^3$, or respectively correspond to 1/10th of a monolayer or more.

19. A process for the manufacture of an electronic or opto-electronic device, the process comprising the steps of:
   providing a free-standing semiconductor substrate according to claim 18, and
   placing further semiconductor layers or a metallic contact for forming an electronic or opto-electronic device.

20. A process for producing a free-standing semiconductor substrate, comprising the steps of:
   providing a starting substrate,
   optionally depositing an initial layer on the starting substrate,
   depositing a mask layer comprising partly or completely of tungsten silicide nitride above the starting substrate, and structuring the mask layer,
   depositing a semiconductor substrate containing at least a nitride compound semiconductor onto said structured mask layer,
   whereupon said semiconductor substrate is capable of self-separating from the starting substrate and the structured mask layer, to thereby produce a free-standing semiconductor substrate.

* * * * *